United States Patent
Eto et al.

(10) Patent No.: US 11,542,631 B2
(45) Date of Patent: Jan. 3, 2023

(54) METHOD FOR PRODUCING P-TYPE 4H-SIC SINGLE CRYSTAL

(71) Applicants: NATIONAL INSTITUTE OF ADVANCED INDUSTRIAL SCIENCE AND TECHNOLOGY, Tokyo (JP); SHOWA DENKO K.K., Tokyo (JP); DENSO CORPORATION, Aichi (JP)

(72) Inventors: Kazuma Eto, Tsukuba (JP); Tomohisa Kato, Tsukuba (JP); Hiromasa Suo, Tsukuba (JP); Yuichiro Tokuda, Miyoshi (JP)

(73) Assignees: NATIONAL INSTITUTE OF ADVANCED INDUSTRIAL SCIENCE AND TECHNOLOGY, Tokyo (JP); SHOWA DENKO K.K., Tokyo (JP); DENSO CORPORATION, Kariya (JP)

( * ) Notice: Subject to any disclaimer, the term of this patent is extended or adjusted under 35 U.S.C. 154(b) by 295 days.

(21) Appl. No.: 16/914,506

(22) Filed: Jun. 29, 2020

(65) Prior Publication Data

US 2020/0325595 A1    Oct. 15, 2020

Related U.S. Application Data

(62) Division of application No. 15/763,596, filed as application No. PCT/JP2016/078834 on Sep. 29, 2016, now abandoned.

(30) Foreign Application Priority Data

Sep. 30, 2015 (JP) .................................. 2015-192724

(51) Int. Cl.
  *C30B 23/06* (2006.01)
  *C30B 29/36* (2006.01)
  (Continued)

(52) U.S. Cl.
  CPC ............ *C30B 23/06* (2013.01); *C30B 23/002* (2013.01); *C30B 29/36* (2013.01); *H01B 1/04* (2013.01);
  (Continued)

(58) Field of Classification Search
  CPC ....... C30B 23/002; C30B 23/06; C30B 29/36; H01B 1/04; H01L 21/02447; H01L 21/0252
  See application file for complete search history.

(56) References Cited

U.S. PATENT DOCUMENTS

| 5,433,167 A | * | 7/1995 | Furukawa | ............... C30B 23/02 |
| | | | | 117/88 |
| 7,422,634 B2 | * | 9/2008 | Powell | .............. H01L 29/66068 |
| | | | | 257/E21.321 |

(Continued)

FOREIGN PATENT DOCUMENTS

| CN | 1344336 A | 4/2002 |
| JP | 2008-538542 A | 10/2008 |

(Continued)

OTHER PUBLICATIONS

International Search Report dated Nov. 22, 2016 issued by the International Searching Authority in international application No. PCT/JP2016/078834.

(Continued)

*Primary Examiner* — Robert M Kunemund
(74) *Attorney, Agent, or Firm* — Xsensus LLP

(57) ABSTRACT

A method for producing a p-type 4H—SiC single crystal includes sublimating a nitrided aluminum raw material and a SiC raw material. Further, there is a stacking of a SiC single crystal, which is co-doped with aluminum and nitrogen, on one surface of a seed crystal.

20 Claims, 2 Drawing Sheets

(51) Int. Cl.
 H01L 21/02 (2006.01)
 C30B 23/00 (2006.01)
 H01B 1/04 (2006.01)
(52) U.S. Cl.
 CPC .... H01L 21/0262 (2013.01); H01L 21/02447 (2013.01)

(56) References Cited

U.S. PATENT DOCUMENTS

| | | | |
|---|---|---|---|
| 2006/0213430 A1* | 9/2006 | Jenny | H01L 21/324 117/945 |
| 2006/0243984 A1 | 11/2006 | Gupta et al. | |
| 2010/0289033 A1 | 11/2010 | Ohtani et al. | |
| 2010/0308344 A1 | 12/2010 | Seki et al. | |
| 2012/0025153 A1 | 2/2012 | Hirose et al. | |
| 2014/0283736 A1 | 9/2014 | Nishio et al. | |

FOREIGN PATENT DOCUMENTS

| | | |
|---|---|---|
| JP | 2009-167047 A | 7/2009 |
| JP | 2009-179491 A | 8/2009 |
| JP | 2012-031014 A | 2/2012 |
| JP | 2014-187113 A | 10/2014 |
| JP | 2015-30640 A | 2/2015 |
| WO | 00/22203 A | 4/2000 |

OTHER PUBLICATIONS

Written Opinion dated Nov. 22, 2016 issued by the International Searching Authority in international application No. PCT/JP2016/078834.
Kazuma Eto et al., "Growth study of p-type 4H-SiC with using aluminum and nitrogen co-doping by 2-zone heating sublimation method", Materials Science Forum, vols. 821-823, (2015), pp. 47-50 (4 pages total).
A. Kakanakova-Georgieva et al., "Site-occupying behavior of boron in compensated p-type 4H-SiC grown by sublimation epitaxy", Journal of Applied Physics, vol. 91, No. 5, Mar. 2002, pp. 3471-3473 (3 pages total).
Kazuma Eto et al., Growth of low resistivity p-type 4H-SiC crystals by sublimation with using aluminum and nitrogen co-doping, Materials Science Forum, vol. 858, pp. 77-80, 2016 (4 pages total).
Takeshi Mitani et al.,"4H-SiC Growth from Si—Cr—C Solution under Al and N Co-doping Conditions", Materials Science Forum, vols. 821-823, (2015), pp. 9-13 (5 pages total).
"Silicon Carbide and Related Materials 2014", Materials Science Forum, vols. 821-823 (2015) colophon, 2 pages total.
T. Shirai, et al., "Solution growth of p-type 4H SiC bulk crystals with low resistivity", Materials Science Forum, vols. 778-780, (2014), pp. 75-78, 9 pages total.
St. G. Muller, et al., "Sublimation-grown Semi-insulating SiC for High Frequency Devices", Materials Science Forum, vols. 433-436, (2003), pp. 39-44, 6 pages total.
A. Ellison, et al., "HTCVD grown semi-insulating SiC substrates", Materials Science Forum vols. 433-436, (2003), pp. 33-38, 6 pages total.
Written Opinion dated Jul. 2, 2019 for the examination of corresponding Japanese Patent Application No. 2015-192724.
Written Submission of publication, etc. to Commissioner of the Patent Office dated Sep. 26, 2019 for the examination of corresponding Japanese Patent Application No. 2015-192724.
Chu Jun-ho et al., General Knowledge Evidence 1: Wide Band Gap Semiconductor Materials, Semiconductor Materials Technology, Feb. 28, 2010, 4 pages.

* cited by examiner

METHOD FOR PRODUCING P-TYPE 4H-SIC SINGLE CRYSTAL

CROSS-REFERENCE TO RELATED APPLICATIONS

The present application is a divisional of U.S. application Ser. No. 15/763,596, filed Mar. 27, 2018, now abandoned, which is based on PCT filing PCT/JP2016/078834, filed Sep. 29, 2016, which claims priority to JP 2015-192724, filed Sep. 30, 2015, the entire contents of each are incorporated herein by reference.

TECHNICAL FIELD

The present invention relates to a p-type 4H—SiC single crystal and a method for producing the p-type 4H—SiC single crystal. Priority is claimed on Japanese Patent Application No. 2015-192724, filed on Sep. 30, 2015, the content of which is incorporated herein by reference.

BACKGROUND ART

Silicon carbide (SiC) has a dielectric breakdown electric field which is larger by one order of magnitude than silicon (Si), and has a band gap three times larger than silicon (Si). Silicon carbide (SiC) has characteristics such as having a thermal conductivity which is about three times higher than silicon (Si). Silicon carbide (SiC) is expected to be applied to power devices, high-frequency devices, high-temperature operation devices, and the like.

In particular, a 4H—SiC single crystal has a high mobility and is expected to be used for power devices. For example, Patent Document 1 discloses that an n-type 4H—SiC single crystal co-doped with a donor element and an acceptor element has a low resistivity.

Meanwhile, sufficient progress has not been made to lower resistance of the p-type 4H—SiC single crystal. This is because there are problems that a hole as a p-type carrier has a lower mobility than an electron as an n-type carrier; aluminum or boron as an acceptor of a p-type SiC has a larger ionization energy and a lower activation rate than nitrogen as a donor of an n-type SiC; as a doping amount of aluminum or the like increases, polymorphs are increased to result in deterioration of crystallinity; and the like.

On the other hand, in order to develop a SiC bipolar device with a high breakdown voltage exceeding 10 kV in assuming utilization of power infrastructure or the like, development of a low resistance p-type 4H—SiC single crystal is an important factor. For example, as a substrate for manufacturing an n-channel SiC insulated-gate bipolar transistor (IGBT) or the like, a low resistance p-type 4H—SiC single crystal is used.

Under these circumstances, development of a p-type 4H—SiC single crystal has recently been progressing. For example, Non-Patent Document 1 discloses that by co-doping of aluminum and nitrogen, polymorphs can be prevented from being generated in a p-type 4H—SiC.

CITATION LIST

Patent Literature

[Patent Document 1] Japanese Unexamined Patent Application. First Publication No. 2015-30640

Non-Patent Literature

[Non-Patent Document 1] Kazuma Eto et al., Materials Science Forum, Vols. 821-823(2015) pp. 47-50.

SUMMARY OF INVENTION

Technical Problem

However, it cannot be said that a sufficiently low resistivity is achieved even in the p-type 4H—SiC single crystal disclosed in Non-Patent Document 1.

The present invention has been made in view of the above problems, and an object thereof is to provide a low resistance p-type 4H—SiC single crystal. Another object of the present invention is to provide a simple method for producing the low resistance p-type 4H—SiC single crystal.

Solution to Problem

As a result of intensive studies, the present inventors found that in a case where a SiC single crystal is grown by a sublimation method, nitrogen can be introduced at a high concentration into a p-type 4H—SiC single crystal by using a nitrided aluminum raw material. Consequently, the present inventors found that polymorphs can be prevented from being generated, and thus allows an extremely low resistance p-type 4H—SiC single crystal to be obtained. Accordingly, the present invention has been completed.

That is, the present invention provides the following measures to solve the above problems.

(1) According to an embodiment of the present invention, there is provided a p-type 4H—SiC single crystal, which is doped with both aluminum and nitrogen, and of which a nitrogen concentration is $2.0 \times 10^9/\text{cm}^3$ or more and an aluminum concentration is $1.0 \times 10^{20}$ cm$^3$ or more.

(2) In the p-type 4H—SiC single crystal described in (1), the aluminum concentration may be $1.8 \times 10^{20}/\text{cm}^3$ or more.

(3) In the p-type 4H—SiC single crystal described in (1) or (2), a stacking fault density thereof may be 50/cm or less.

(4) In the p-type 4H—SiC single crystal described in any one of (1) to (3), a concentration of any element from the group consisting of phosphorus, arsenic, titanium, vanadium, chromium, copper, iron, and nickel may be $2 \times 10^{15}/\text{cm}^3$ or less.

(5) In the p-type 4H—SiC single crystal described in any one of (1) to (4), a thickness thereof may be 1 mm or more.

(6) A method for producing a p-type 4H—SiC single crystal according to the embodiment of the present invention includes a sublimation step of sublimating a nitrided aluminum raw material and a SiC raw material; and a crystal-growth step of stacking a SiC single crystal, which is co-doped with aluminum and nitrogen, on one surface of a seed crystal.

(7) Regarding the method for producing a p-type 4H—SiC single crystal described in (6), in the sublimation step, the nitrided aluminum raw material and the SiC raw material are disposed separately from each other, and are sublimated at different temperatures.

(8) Regarding the method for producing a p-type 4H—SiC single crystal described in (6) or (7), the sublimation step and the crystal-growth step are performed under a nitrogen gas atmosphere.

(9) The method for producing a p-type 4H—SiC single crystal described in any one of (6) to (8) may further include a step of nitriding an aluminum raw material to prepare the nitrided aluminum raw material, before the sublimation step.

Advantageous Effects of Invention

The SiC single crystal according to the embodiment of the present invention is doped with nitrogen at a high concentration. As a result, it is possible to provide a p-type 4H—SiC single crystal having a low resistivity.

DESCRIPTION OF EMBODIMENTS

Figure 1:
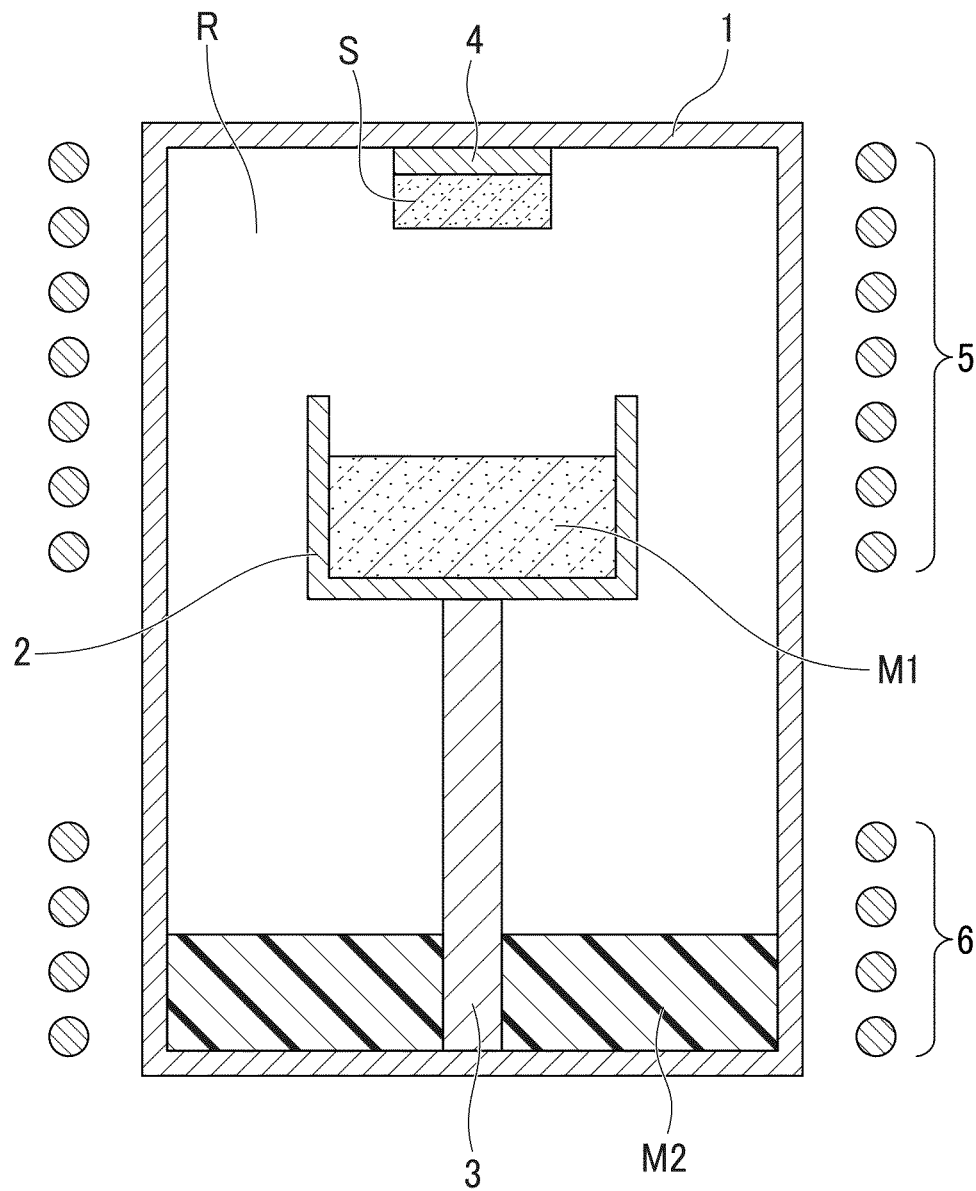
FIG. 1 is a schematic cross-sectional view showing an example of a SiC single crystal production apparatus that can be used in a method for producing a p-type 4H—SiC single crystal according to the embodiment of the present invention.

Hereinafter, the present invention will be described in detail with proper reference to the drawings.

In the drawings used in the following description, in order to clarify the features of the present invention, characteristic portions may be enlarged for the sake of convenience, and dimensional ratios and the like of the respective components may be different from actual ones. The materials, dimensions, and the like in the following description are merely exemplary examples, and the present invention is not limited thereto. Thus, an appropriate modification can be made to carry out the present invention within a scope that does not change the gist of the present invention.

(P-Type 4H—SiC Single Crystal)

A p-type 4H—SiC single crystal according to the embodiment of the present invention is a p-type semiconductor co-doped with aluminum and nitrogen. Due to the fact of being a p-type semiconductor, a carrier is a hole generated by activation following doping of aluminum as an acceptor.

The p-type 4H—SiC single crystal according to the embodiment of the present invention has a nitrogen concentration of $2.0\times10^{19}/cm^3$ or more. The nitrogen concentration is preferably $1.0\times10^{20}/cm^3$ or more, and more preferably $1.5\times10^{20}/cm^3$ or more.

By doping aluminum and nitrogen at high concentrations, it is possible to obtain a low resistance p-type 4H—SiC single crystal having 100 mΩcm or less. Among SiC single crystals obtained by a sublimation method, a low resistance p-type 4H—SiC single crystal having 100 mΩcm or less has never been reported so far, and such resistance value was firstly reached by the p-type 4H—SiC single crystal according to the embodiment of the present invention.

It is known that by co-doping of aluminum and nitrogen, polymorphs can be prevented from being generated in a crystal-growth procedure of SiC. It is said that this is because distortion generated in a crystal structure due to a size of one atom (aluminum or nitrogen) is corrected by the other atom. Aluminum increases crystal lattice and nitrogen decreases crystal lattice. Therefore, it is considered that increased doping amount of nitrogen results in increased crystallinity of a p-type 4H—SiC single crystal and allows a 4H crystal to be obtained even in a case where an aluminum concentration is increased.

The p-type 4H—SiC single crystal is a p-type. Thus, an aluminum concentration thereof is higher than a nitrogen concentration thereof. In other words, the nitrogen concentration is less than or equal to the aluminum concentration. The aluminum concentration of the p-type 4H—SiC single crystal is preferably $1.0\times1^{20}/cm^3$ or more, more preferably $1.8\times10^{20}/cm^3$ or more, and still more preferably $2.0\times10^{20}/cm^3$ or more.

In a case where the aluminum concentration is high, a hole as a carrier can be increased in the SiC single crystal, and a resistivity of the SiC single crystal can be decreased. Meanwhile, although it depends on a relationship with the nitrogen concentration, in a case where the aluminum concentration is too high, polymorphs may be generated in a crystal structure. Therefore, the aluminum concentration is preferably $3\times10^{21}/cm^3$ or less.

The crystal structure of the p-type 4H—SiC single crystal is 4H—SiC and does not have other polymorphs. The SiC single crystal has polymorphs such as 3C—SiC, 4H—SiC, 6H—SiC, and the like. Polymorphs are generated due to the fact that crystal structures of SiC do not differ as a top surface structure in a case of being viewed from a c-axis direction (<000-1> direction). Therefore, in a case where a crystal is grown in the c-axis direction, a structural change easily occurs to cause polymorphs (heterogeneous polymorphs) that have a different structure from a 4H—SiC structure.

Presence of polymorphs can lower crystallinity of the SiC single crystal, and thus be a cause for increased resistivity. In addition, in a case where polymorphs such as 6H—SiC are mixed, it is not possible to manufacture an originally intended device. In a case where the crystal structure of the p-type 4H—SiC single crystal is composed only of 4H—SiC, it is possible to achieve a high crystallinity and a low resistivity, and to stably manufacture the device. Prevention of polymorphs from being generated can be performed by co-doping of aluminum and nitrogen as described above.

The p-type 4H—SiC single crystal according to the embodiment of the present invention preferably has a stacking fault density of 50/cm or less, and more preferably does not contain any stacking fault.

The stacking fault is a defect that is formed in a base plane direction of the SiC single crystal and may deteriorate crystallinity to affect an operation of the device.

Although there are various causes for occurrence of the stacking fault, disturbance of the crystal structure is one cause for the occurrence. In a case where an attempt is made to grow an ordered crystal structure on a layer with a disturbed crystal structure, it is necessary to absorb the disturbance in any form, in which a local structural strain appears as a stacking fault. That is, stacking fault can be regarded as a polymorph which is locally occurred. For example, it is considered that disturbance in a <000-1> direction parallel to a growth direction is converted into a Frank stacking fault or the like, and disturbance in a <11-20> direction or <1-100> direction perpendicular to the growth direction is converted into a Shockley stacking fault or the like.

The stacking fault in the p-type 4H—SiC single crystal can be reduced by co-doping of aluminum and nitrogen. This is because distortion of the crystal structure can be relieved by co-doping of aluminum and nitrogen. In a case where the stacking fault density in the p-type 4H—SiC single crystal is small, it is possible to reduce a defective region affecting the device in the SiC single crystal, and to increase yield and reliability of the device.

It is preferable that the p-type 4H—SiC single crystal according to the embodiment of the present invention also has a concentration of $2 \times 10^{15}/cm^3$ or less for any element from the group consisting of phosphorus, arsenic, titanium, vanadium, chromium, copper, iron, and nickel. In addition, it is more preferable that these elements are present at a concentration less than or equal to a detection limit of secondary ion mass spectrometry (SIMS).

In a case of using a production method of a SiC single crystal with a solution method or the like, in order to obtain a SiC single crystal having a normal surface state, an additional element such as chromium, titanium, and copper is often added to a solvent. Therefore, the SiC single crystal produced by the solution method or the like may contain these elements as impurities, although those elements are present in a small amount. These impurities result in deteriorated crystallinity in the SiC single crystal, defects after device processing, and the like.

The p-type 4H—SiC single crystal according to the embodiment of the present invention can be produced by a sublimation method as described later. Therefore, these impurities and the like can be prevented from being taken into the SiC single crystal.

The p-type 4H—SiC single crystal may be a single crystal ingot made of a bulky single crystal or a SiC wafer obtained by processing a SiC single crystal ingot into a wafer. Generally, the SiC wafer has a thickness of about several hundred μm. In addition, since the SiC ingot is a bulky single crystal from which a plurality of SiC wafers can be cut, it has a thickness of 1 mm or more.

In a case where a manufacturing method of a p-type 4H—SiC single crystal substrate using a sublimation method described later is used, it is possible to obtain a low resistance p-type 4H—SiC single crystal in both the single crystal ingot and the SiC wafer. The p-type 4H—SiC single crystal can also be obtained by epitaxial growth. However, it is extremely difficult to prepare a p-type 4H—SiC single crystal having a growth thickness exceeding 1 mm by a method using the epitaxial growth, and such method has a poor productivity.

As described above, the p-type 4H—SiC single crystal according to the embodiment of the present invention can realize a low resistance having a resistivity of 100 mΩcm or less. Therefore, it can be expected to be applied to various applications such as an n-channel SiC insulated-gate bipolar transistor (IGBT).

Further, the p-type 4H—SiC single crystal according to the embodiment of the present invention has a high crystallinity and no polymorphs. Therefore, a low resistance can be realized, and reliability of the device can be increased.

Further, the p-type 4H—SiC single crystal according to the embodiment of the present invention has almost no stacking fault. Therefore, it is possible to reduce occurrence of killer defects or the like of the device, and to improve yield of device manufacture, reliability of the device, and the like.

(Production Method of p-Type 4H—SiC Single Crystal)

A method for producing the p-type 4H—SiC single crystal according to the embodiment of the present invention includes a sublimation step of sublimating a nitrided aluminum raw material and a SiC raw material; and a crystal-growth step of stacking a SiC single crystal, which is co-doped with aluminum and nitrogen, on one surface of a seed crystal.

FIG. 1 is a schematic cross-sectional view showing an example of a SiC single crystal production apparatus that can be used in a method for producing a p-type 4H—SiC single crystal according to the embodiment of the present invention. The SiC single crystal production apparatus 10 includes a crucible 1 defining a reaction space R, a hold section 2 capable of holding a SiC raw material M1, a support section 3 supporting the hold section 2, a placement section 4 capable of placing a seed crystal S, a first heater 5 for heating a first region, and a second heater 6 for heating a second region. On a bottom of the crucible 1, an aluminum raw material M2 can be placed. Hereinafter, using this SiC single crystal production apparatus 10 as an example, the method for producing the p-type 4H—SiC single crystal according to the embodiment of the present invention will be described.

First, the SiC raw material M1 and the aluminum raw material M2 are prepared.

As the SiC raw material M1, generally, widely used SiC powders or the like can be used. The aluminum raw material M2 may be either a nitrided aluminum compound or a non-nitrided aluminum compound. In a case of using the non-nitrided aluminum compound, the aluminum raw material M2 is nitrided in a production procedure described later. As the nitrided aluminum compound, AlN, $Al_5C_3N$, or the like can be used. As the non-nitrided aluminum compound, $Al_4C_3$ or the like can be used.

It is preferable that the SiC raw material M1 and the aluminum raw material M2 are placed separately from each other. For example, the SiC raw material M1 can be placed in the hold section 2, and the aluminum raw material M2 can be placed in the bottom of the crucible 1.

Next, the SiC raw material M1 and the aluminum raw material M2 are sublimated. It is preferable to sublimate the SiC raw material M1 and the aluminum raw material M2 at different temperatures.

In a range of 1500° C. to 2500° C., a vapor pressure of the SiC raw material M1 is lower than a vapor pressure of the aluminum raw material M2. Therefore, in a case where the aluminum raw material M2 is heated under a condition in which an ordinary SiC raw material M1 is sublimated, a sublimation rate of the aluminum raw material M2 increases, thereby causing problems in adjusting a doping amount of aluminum and in a SiC crystal-growth. These problems can be solved by placing the SiC raw material M1 and the aluminum raw material M2 separately from each other and performing temperature control of the respective materials with different coils.

Temperature control of the SiC raw material M1 and the aluminum raw material M2 can be realized by the first heater 5 and the second heater 6. For example, the first heater 5 is designed to heat the first region of the crucible 1 where the SiC raw material M1 exists, and the second heater 6 is designed to heat the second region of the crucible 1 where the aluminum raw material M2 exists. By designing in this manner, the temperatures of the SiC raw material M1 and the aluminum raw material M2 can be separately controlled. More specifically, the temperature of the first heater 5 can be set to about 2200° C. to 2500° C. at which the SiC raw material M1 can be sublimated, and the temperature of the second heater 6 can be set to about 1700° C. to 2000° C. at which the aluminum raw material M2 can be sublimated.

In a case where the aluminum raw material M2 is not nitrided, it is preferable to nitride the aluminum raw material M2 before sublimation to prepare a nitrided aluminum raw material. Nitriding of the aluminum raw material M2 can be performed by heating in a nitrogen atmosphere. For example, the aluminum raw material M2 may be nitrided in another apparatus or may be nitrided in the crucible 1 before placing the SiC raw material M1.

Further, by placing the aluminum raw material M2 in the crucible 1 without nitriding and setting an atmosphere in the crucible 1 to an environment in which the aluminum raw material M2 is easily nitrided, the aluminum raw material M2 may be intentionally nitrided during the sublimation step. Specifically, measures can be taken, such as setting the inside of the reaction space R before a sublimation treatment to an atmosphere consisting only of nitrogen, supplying nitrogen from a bottom side where the aluminum raw material M2 is placed into the crucible 1, or the like.

The sublimated raw material gas reaches the seed crystal S placed in the placement section 4, where a SiC single crystal is grown. The crystal-growth step proceeds naturally by sublimating the SiC raw material M1 and the aluminum raw material M2. The gas sublimated from the aluminum raw material M2 contains both aluminum and nitrogen. Thus, during the crystal-growth, these elements are taken into the crystal. As a result, a p-type 4H—SiC single crystal doped with both aluminum and nitrogen can be obtained.

The sublimation step is preferably performed under a nitrogen gas atmosphere. Here, the nitrogen gas atmosphere means that the gas supplied into the crucible is only nitrogen. In other words, this means that the gas species which is present in the atmosphere is only nitrogen besides sublimation gas which is sublimated from the SiC raw material M1 and the aluminum raw material M2.

By setting the inside of the reaction space R to a nitrogen gas atmosphere, nitriding of the aluminum raw material M2 can be promoted and nitrogen doping into the grown SiC single crystal can be performed. That is, by setting the inside of the reaction space R to a nitrogen gas atmosphere, nitrogen can be doped at a higher concentration into a p-type 4H—SiC single crystal which is being grown. Doping nitrogen into a p-type 4H—SiC single crystal at a higher concentration has not been realized even in Non-Patent Document 1.

Supply of a nitrogen gas into the reaction space R can be performed via the crucible 1. The crucible 1 has a nitrogen gas permeability. Therefore, even in a case where the crucible 1 is not provided with a gas supply section, by setting an atmosphere surrounding the crucible 1 to a nitrogen gas atmosphere, a gas atmosphere in the reaction space R can also be a nitrogen gas atmosphere.

As described above, in the method for producing the p-type 4H—SiC single crystal according to the embodiment of the present invention, by nitriding an aluminum raw material or using a nitrided aluminum raw material, a nitrogen concentration of the obtained p-type 4H—SiC single crystal can be increased. As a result, a p-type 4H—SiC single crystal having a low resistivity can be simply produced.

Further, the method for producing the p-type 4H—SiC single crystal according to the embodiment of the present invention uses a sublimation method. Thus, even a SiC ingot having a thickness of several mm or more can be relatively easily produced. In a method using epitaxial growth, it is not realistic to produce a SiC ingot having a thickness of several mm or more, and a productivity thereof is also extremely poor. In addition, the method for producing the p-type 4H—SiC single crystal according to the embodiment of the present invention uses a sublimation method. Thus, unlike a solution method, unnecessary impurities or the like can be prevented from being taken into the crystal.

Although the preferred embodiments of the present invention have been described in detail above, the present invention is not limited to the specific embodiments, and various changes and modifications may be made within a scope of the gist of the present invention described in the claims.

EXAMPLES

Hereinafter, examples of the present invention will be described. The present invention is not limited only to the following examples.

Example 1

In Example 1, a p-type 4H—SiC single crystal was produced using an apparatus having the same configuration as that of the SiC single crystal-growth apparatus shown in FIG. 1. A specific procedure will be described below.

First, as an aluminum raw material, $Al_4C_3$ powder was prepared. The prepared $Al_4C_3$ powder was nitrided in advance in the apparatus. The nitriding condition was heating at 1,800° C. for 110 hours under a gas atmosphere with a nitrogen concentration of 100%.

Figure 2:
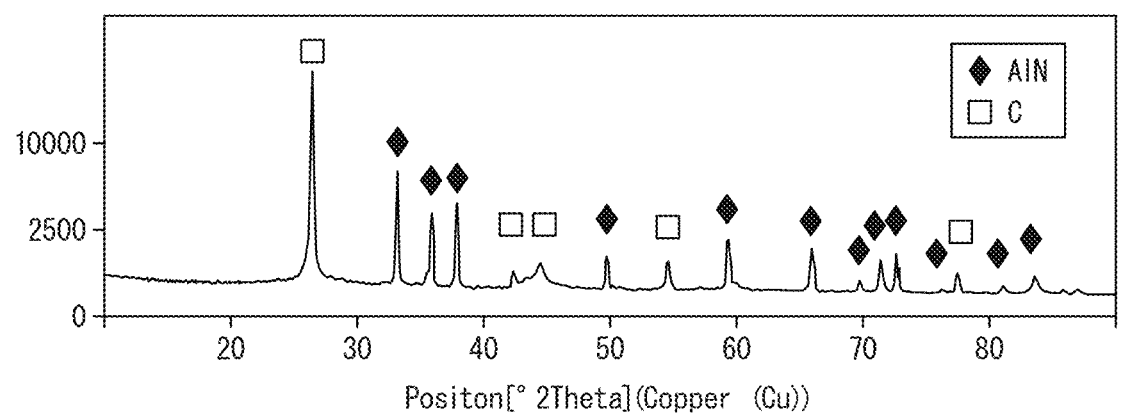
FIG. 2 shows an X-ray diffraction result of an aluminum raw material after a nitriding treatment.

FIG. 2 shows an X-ray diffraction result of an aluminum raw material after the nitriding treatment. The horizontal axis represents an angle 2 θ between an incident X-ray and a diffracted X-ray, and the vertical axis represents an intensity. It can be seen that the obtained diffraction line is composed of a peak derived from C and a peak derived from AlN, and most of the aluminum raw material of Example 1 is changed to AlN. In addition, in a case where similar studies were conducted with other samples, a peak derived from $Al_5C_3N$ was identified in some cases. That is, it has been shown that after the nitriding treatment, most of the aluminum raw material is nitrided to become AlN/$Al_5C_3N$.

The nitrided aluminum raw material thus obtained and the SiC raw material composed of SiC powder were separately placed in the crucible. Then, the concentration of nitrogen gas in the crucible was set to 5%.

Then, the aluminum raw material was heated to 1900° C. and the SiC raw material was heated to 2300° C. Each of the materials was sublimated by heating to obtain a SiC single crystal. At this time, the treatment time was 30 hours, and the obtained SiC single crystal had a thickness of 2.7 mm.

The obtained SiC single crystal was cut into a wafer having a thickness of 0.2 mm, and a resistivity was measured therefor. Hall measurement by the Vander Pauw method was used for measurement of resistivity. In addition, at the same time, a nitrogen concentration and an aluminum concentration were also measured therefor. The nitrogen concentration and the aluminum concentration were measured by using secondary ion mass spectrometry (SIMS), and a crystal structure thereof was measured by Raman measurement. As a result, the resistivity was 86 mΩcm, the nitrogen concentration was $1.5 \times 10^{20}/cm^3$, the aluminum concentration was $1.8 \times 10^{20}/cm^3$, and the crystal structure was 4H—SiC.

A concentration of impurities in the SiC single crystal obtained in Example 1 was also measured by using secondary ion mass spectrometry (SIMS). The results are shown in Table 1.

TABLE 1

| Impurity element | Concentration (/cm³) |
| --- | --- |
| Phosphorous (P) | $<2.0 \times 10^{15}$ |
| Arsenic (As) | $<2.0 \times 10^{15}$ |
| Titanium (Ti) | $1.0 \times 10^{15}$ |
| Vanadium (V) | $2.0 \times 10^{14}$ |

TABLE 1-continued

| Impurity element | Concentration (/cm³) |
|---|---|
| Chromium (Cr) | <1.0 × 10¹⁴ |
| Copper (Cu) | <1.0 × 10¹⁵ |

TABLE 1-continued

| Impurity element | Concentration (/cm³) |
|---|---|
| Iron (Fe) | <1.0 × 10¹⁵ |
| Nickel (Ni) | <1.0 × 10¹⁵ |

Vanadium and titanium were detected, but any elements other than these were less than or equal to a detection limit of SIMS and were not detected. In addition, the concentrations of vanadium and titanium detected were low, which are equivalent to those of commercially available SiC wafers.

Figure 3:
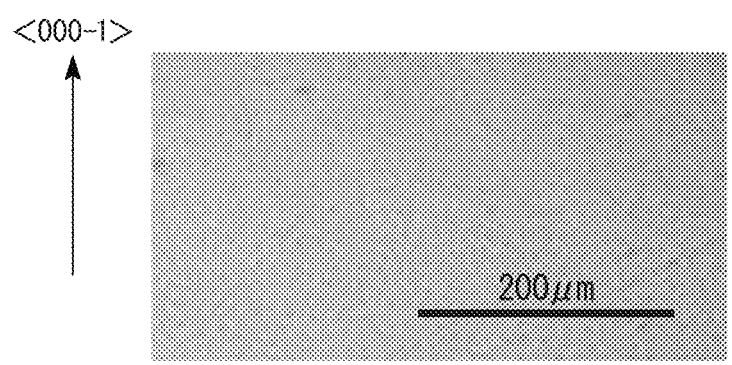
FIG. 3 shows an optical microscopic image obtained at the time of cross-sectionally observing a SiC single crystal produced in Example 1.

Furthermore, cross-sectional observation of the obtained SiC single crystal was also performed. FIG. 3 shows an optical microscopic image obtained at the time of cross-sectionally observing the SiC single crystal produced in Example 1. In FIG. 3, the upward direction is the <000-1> direction.

The cross-sectional observation was performed by the following procedure.

First, the SiC single crystal was cut along a crystal-growth direction (1-100) plane thereof. The cut cross section was polished to a mirror surface, and then treated with KOH. In the treatment, a cut surface of the p-type 4H—SiC single crystal was exposed to a KOH melt at 500° C. for 3 minutes. The cut surface after the treatment was observed with an optical microscope.

In general, in a case where a stacking fault is present, a plurality of linear etch pits are seen in a direction intersecting with <000-1> after the treatment with KOH.

However, in the cross-section observed in FIG. 3, such linear etch pits were not observed after the treatment with KOH. That is, it can be confirmed that no stacking fault is contained in the p-type 4H—SiC single crystal of Example 1.

Examples 2 and 3

Examples 2 and 3 are only different from Example 1 in that the nitrogen concentration during the growth is set to 300% in Example 2, and to 100% in Example 3. The resistivity, nitrogen concentration, aluminum concentration, crystal structure, and stacking fault density of SiC single crystals obtained in Examples 2 and 3 were each measured. The results are shown in Table 2.

Comparative Example 1

Comparative Example 1 is different from Example 1 in that the aluminum raw material is not nitrided in advance and the nitrogen concentration during the growth is set to 0%. The nitrogen concentration, aluminum concentration, and crystal structure of a SiC single crystal obtained in Comparative Example 1 were each measured. The results are shown in Table 2.

TABLE 2

| | Resistivity (mΩcm) | N concentration (/cm³) | Al concentration (/cm³) | Crystal structure | Stacking fault density (/cm) | Nitrogen content during growth (%) |
|---|---|---|---|---|---|---|
| Example 1 | 86 | 1.5 × 10²⁰ | 1.8 × 10²⁰ | 4H | 0 | 5 |
| Example 2 | 88 | 2.3 × 10²⁰ | 3.1 × 10²⁰ | 4H | 0 | 30 |
| Example 3 | 97 | 1.8 × 10²⁰ | 2.6 × 10²⁰ | 4H | 0 | 100 |
| Comparative Example 1 | — | 1.8 × 10¹⁹ | 1.7 × 10²⁰ | 6H | — | 0 |

Due to a high concentration of nitrogen which is taken into a SiC single crystal, a SiC having a crystal structure of 4H can be stably obtained. In addition, in any of Examples 1 to 3, a low resistivity p-type 4H—SiC single crystal having an extremely low resistivity of 100 mΩcm or less can be obtained.

REFERENCE SIGNS LIST

1: Crucible
2: Hold section
3: Support section
4: Placement section
5: First heater
6: Second heater
M1: SiC raw material
M2: Aluminum raw material
S: Seed crystal
R: Reaction space

What is claimed is:

1. A method for producing a p-type 4H—SiC single crystal, comprising:
   sublimating a nitrided aluminum raw material and a SiC raw material; and
   stacking a SiC single crystal, which is co-doped with aluminum and nitrogen, on one surface of a seed crystal,
   wherein for the p-type 4H—SiC single crystal:
   an aluminum concentration is higher than a nitrogen concentration,
   the nitrogen concentration is $2.0 \times 10^{19}$/cm³ or more,
   the aluminum concentration is $1.0 \times 10^{20}$/cm³ or more, and
   a resistivity is 100 mΩcm or less.

2. The method according to claim 1, wherein in the sublimating, the nitrided aluminum raw material and the SiC raw material are disposed separately from each other, and are sublimated at different temperatures.

3. The method according to claim 1, wherein the sublimating and the stacking are performed under a nitrogen gas atmosphere.

4. The method according to claim 1, further comprising:
   nitriding an aluminum raw material to prepare the nitrided aluminum raw material, before the sublimating.

5. The method according to claim 1, wherein the nitrided aluminum raw material comprises aluminum, nitrogen, and carbon.

6. The method according to claim 1, wherein:
   the nitrogen concentration of the p-type 4H—SiC single crystal is $1.0 \times 10^{20}$/cm³ or more, and the aluminum concentration of the p-type 4H—SiC single crystal is $1.8\times10^{20}/cm^3$ or more.

7. A method for producing a SiC wafer comprising:
cutting the SiC wafer from the p-type 4H—SiC single crystal according to claim 1.

8. A method for producing a p-type 4H—SiC single crystal, comprising:
charging $Al_4C_3$ powder into a crystal-growth apparatus;
preparing a nitrified aluminum raw material by heating the $Al_4C_3$ powder under supplying nitrogen gas in the crystal-growth apparatus;
charging a SiC raw material into the crystal-growth apparatus; and
growing the p-type 4H—SiC single crystal on a SiC seed crystal by sublimating the SiC raw material and the nitrided aluminum raw material,
wherein for the p-type 4H—SiC single crystal;
an aluminum concentration is higher than a nitrogen concentration,
the nitrogen concentration is $2.0\times10^{19}/cm^3$ or more,
the aluminum concentration is $1.0\times10^{20}/cm^3$ or more, and
a resistivity is 100 mΩcm or less.

9. The method of claim 8, wherein the nitrided aluminum raw material comprises aluminum, nitrogen, and carbon.

10. The method of claim 8, wherein the nitrided aluminum raw material comprises AlN and $Al_5C_3N$.

11. The method of claim 8, wherein:
in the growing, the SiC raw material and the nitrided aluminum raw material are disposed separately from each other in the crystal-growth apparatus,
the growing further comprises heating the SiC raw material and heating the nitrided aluminum raw material,
a temperature of the heating of the SiC raw material is higher than a temperature of the heating of the nitrided aluminum raw material, and
the temperature of the heating of the nitrided aluminum raw material is 1700~2000° C.

12. The method of claim 8, wherein:
the growing is performed with nitrogen gas in the crystal-growth apparatus, and
a concentration of the nitrogen gas is a range of 5% to 100%.

13. A method for producing a SiC wafer comprising:
cutting the SiC wafer from the p-type 4H—SiC single crystal according to claim 8.

14. A method for producing a p-type 4H—SiC single crystal, comprising:
charging a SiC raw material and an aluminum raw material into a crystal-growth apparatus; and
growing the p-type 4H—SiC single crystal on a SiC seed crystal by sublimating the SiC raw material and the aluminum raw material with nitrogen gas in the crystal-growth apparatus,
wherein the p-type 4H—SiC single crystal includes:
an aluminum concentration higher than a nitrogen concentration,
the nitrogen concentration of $2.0\times10^{19}/cm^3$ or more, and
the aluminum concentration of $1.0\times10^{20}/cm^3$ or more.

15. The method of claim 14, wherein a resistivity of the p-type 4H—SiC single crystal is 100 mΩcm or less.

16. The method of claim 14, wherein:
the nitrogen concentration of the p-type 4H—SiC single crystal is $1.0\times10^{20}/cm^3$ or more, and
the aluminum concentration of the p-type 4H—SiC single crystal is $1.8\times10^{20}/cm^3$ or more.

17. The method of claim 14, wherein a stacking fault density of the p-type 4H—SiC single crystal is 50/cm or less.

18. The method of claim 14, wherein:
in the growing, the SiC raw material and the aluminum raw material are disposed separately from each other in the crystal-growth apparatus, and
the growing further comprises heating the SiC raw material and heating the aluminum raw material,
a heating temperature of the SiC raw material is higher than a heating temperature of the aluminum raw material.

19. The method according to claim 8, wherein:
the nitrogen concentration of the p-type 4H—SiC single crystal is $1.0\times1020/cm3$ or more, and
the aluminum concentration of the p-type 4H—SiC single crystal is $1.8\times1020/cm3$ or more.

20. The method of claim 14, wherein:
the SiC raw material is SiC powder, and
the aluminum raw material is an aluminum compound which includes carbon and/or nitrogen.

* * * * *